United States Patent [19]

Belke, Jr. et al.

[11] Patent Number: 5,783,867

[45] Date of Patent: Jul. 21, 1998

[54] REPAIRABLE FLIP-CHIP UNDERCOATING ASSEMBLY AND METHOD AND MATERIAL FOR SAME

[75] Inventors: Robert Edward Belke, Jr., W. Bloomfield; Bethany Walles, Birmingham; Michael G. Todd, South Lyon; Brian J. Hayden, Royal Oak, all of Mich.

[73] Assignee: Ford Motor Company, Dearborn, Mich.

[21] Appl. No.: 554,181

[22] Filed: Nov. 6, 1995

[51] Int. Cl.$^6$ .......................... H01L 23/48; H01L 23/52; H01L 27/40

[52] U.S. Cl. .......................... 257/783; 257/782

[58] Field of Search .................. 257/782, 783, 257/778

[56] References Cited

U.S. PATENT DOCUMENTS

| | | | |
|---|---|---|---|
| 4,999,699 | 3/1991 | Christie et al. | 357/65 |
| 5,001,542 | 3/1991 | Tsukagoshi et al. | 257/783 |
| 5,162,613 | 11/1992 | Schoenthaler | 174/88 |
| 5,258,648 | 11/1993 | Lin | 257/778 |
| 5,347,162 | 9/1994 | Pasch | 257/779 |
| 5,436,503 | 7/1995 | Kunitomo et al. | 257/737 |
| 5,550,408 | 8/1996 | Kunitomo et al. | 257/783 |
| 5,641,996 | 6/1997 | Omoya et al. | 257/783 |

FOREIGN PATENT DOCUMENTS

| | | | |
|---|---|---|---|
| 0 315 851 | 5/1989 | European Pat. Off. . | |
| 0 340 492 | 11/1989 | European Pat. Off. . | |
| 0 475 022 | 3/1991 | European Pat. Off. . | |
| 0 548 603 | 6/1992 | European Pat. Off. . | |
| 60193353 | 10/1985 | Japan | 21/60 |
| 2-180036 | 7/1990 | Japan | 257/783 |
| 4-323839 | 11/1992 | Japan | 257/783 |
| 5-41408 | 2/1993 | Japan | 257/783 |
| 5-41409 | 2/1993 | Japan | 257/783 |
| 5-47839 | 2/1993 | Japan | 257/783 |

OTHER PUBLICATIONS

Electronic Packaging and Production, 31:43 "Encapsulated Flip Chips More Reliable" (1991).
International Search Report, Feb. 18, 1997.
Poly(aryl Ethers) by Nucleophilic Aromatic Substitution. I. Synthesis and Properties. Johnson, et al.; Journal Of Polymer Science:Part A–1, vol. 5, 2375–2398 (1967).
Aromatic Polyethers of the "Cardic" Type. Vinogradova, S.V. et al; Polymer Science U.S.S.R., 2962–2970, (1971).
Negative Thermal Expansion Ceramics: A Review, Chu, et al.; Materials Science and Engineering, 95 (1987) 303–308.

Primary Examiner—Mahshid D. Saadat
Assistant Examiner—S. V. Clark
Attorney, Agent, or Firm—Lorraine S. Melotik; Roger L. May

[57] ABSTRACT

In a method for reversible assembly of a semiconductor electronic flip-chip device to an electrical interconnecting substrate, a filled thermoplastic adhesive is interposed between an active face of the flip-chip device and a bond site on the substrate. Electrical connection is established between the flip-chip device and the substrate and, generally simultaneously, adhesive bonding between them is established via viscous flow of the filled thermoplastic adhesive above its glass transition temperature, followed by cooling of the adhesive. The adhesive can be reheated to free the flip-chip device of its adhesive bond to the substrate. The filled thermoplastic adhesive includes a low expansion filler in a binder matrix. In accordance with one aspect of the invention, the binder matrix is poly(aryl ether ketone) having the chemical formula

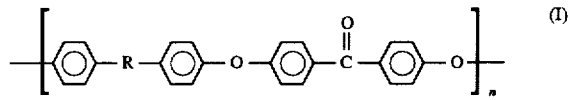

where n is from 5 to 150 and R is selected from suitable divalent moieties. The filled thermoplastic adhesive can be interposed between the flip-chip device and the substrate as a preform or by other suitable method, such as syringe extrusion in a molten or viscous state.

3 Claims, 3 Drawing Sheets

REPAIRABLE FLIP-CHIP UNDERCOATING ASSEMBLY AND METHOD AND MATERIAL FOR SAME

FIELD OF THE INVENTION

The present invention is directed to semiconductor devices and, more specifically, to flip-chip semiconductor devices and to methods and material for making such flip-chip semiconductor devices.

BACKGROUND

Flip-chip semiconductor devices are well known in the electronics industry, in which a typically packageless semiconductor device, such as an integrated circuit, etc., is mounted to a substrate, such as a printed circuit board (PCB) or printed wiring board (PWB), in a die-down or chip-down position, that is, with the electrical interconnects facing downward toward the substrate. That is, an active surface of a semiconductor die is mounted facing the substrate, typically by bonding a plurality of conductive bumps, for example, solder bumps on the interconnect pads of the active surface, to corresponding electrical terminals on the mounting surface of the substrate. Advantageously, the electrical connections between the semiconductor die and the substrate are thereby generally confined to an area not substantially exceeding the size of the die, i.e., its so-called footprint size.

In order to achieve a structurally robust attachment of the flip-chip device to the substrate, it is known to use an undercoat adhesive, typically a thermosetting epoxy adhesive, sandwiched between the active face of the flip-chip device and the underlying mounting surface of the substrate. The epoxy is placed in an uncured state around the periphery of the flip-chip device after electrical connection has been established. The epoxy wicks by capillary action to at least partially fill the cavity between the flip-chip device and the substrate, following which it is cured in an oven or the like. Substantial assembly complexity is incurred in carrying out this undercoating operation. In addition, the amount of low cost, low expansion filler, such as $SiO_2$ which can be added to the thermosetting epoxy is limited by the need to maintain a sufficiently flowable rheology. It would be desirable to employ higher weight percent of a low expansion filler in order to achieve a desirably low composite linear coefficient of thermal expansion (composite CTE). An undesirably high composite CTE of known undercoat adhesives inhibits the use of alternative technologies for establishing electrical connection between the flip-chip device and the substrate, such as Au/Au diffusion bonding, etc. Another disadvantage of current flip-chip undercoat technology is the inability to repair or replace the flip-chip device following curing of the adhesive. While the electrical connection established by solder bonding or the like between the flip-chip device and the substrate could be released by heating, it would not release the undercoat adhesive.

It is an object of the present invention to provide flip-chip undercoat assemblies, methods and materials having good performance characteristics. It is a particular object of at least certain preferred embodiments to provide repairable flip-chip assemblies and methods for the reversible assembly of flip-chip devices to electrical interconnecting substrates. These and additional objects and features will be apparent from the following disclosure of the invention and detailed description of certain preferred embodiments.

SUMMARY

In accordance with a first aspect, a repairable flip-chip assembly comprises a semiconductor electronic flip-chip device having an electronic circuit and a plurality of peripheral bonding pads on an active surface facing a substrate surface. The bonding pads of the flip-chip device are coupled to a corresponding plurality of bonding pads on the substrate surface. A filled thermoplastic adhesive is sandwiched between the flip-chip device and the substrate surface, adhesively fixing the flip-chip device to the substrate. As discussed further below in connection with certain preferred embodiments, the filled thermoplastic adhesive preferably has a glass transition temperature between about 85° and 400° C. and a composite coefficient of thermal expansion between 5 and 40 ppm/°C., more preferably for automotive applications a glass transition temperature between about 150° and 240° C. and a composite coefficient of thermal expansion between 15 and 25 ppm/°C.

In accordance with a second aspect, the semiconductor electronic flip-chip device can be reversibly assembled to the substrate by interposing the filled thermoplastic adhesive between the active face of the flip-chip device and the attachment site or bond site on the substrate surface. The filled thermoplastic adhesive undergoes viscous flow at a temperature above its glass transition temperature, and then cools to form a thermally reversible adhesive bond between the flip-chip device and the substrate.

In accordance with a third aspect of the invention, the filled thermoplastic adhesive comprises low expansion filler and poly(aryl ether ketone). The filler is "low expansion" in the sense that it has an advantageously low coefficient of thermal expansion, being preferably less than about 30 ppm/°C. The filled thermoplastic adhesive has a composite coefficient of expansion determined by the individual coefficients of expansion of the filler material, the thermoplastic adhesive and the other components, if any. Thus, the low coefficient of thermal expansion of the filler contributes to an advantageously low composite coefficient of expansion for the filled thermoplastic adhesive used in the assembly methods and resulting assemblies disclosed here. The filled thermoplastic adhesive has processing characteristics resulting in viscous flow between the flip-chip device and the substrate, most preferably under pressure and heat employed in establishing the desired electrical connections.

It will be recognized by those skilled in the art, that is, those who are knowledgeable and experienced in this area of technology, that the present invention is a significant technological advance. Particularly in the case of certain preferred embodiments, significant improvements and advantages are achieved. Relatively rapid flip-chip assembly can be achieved, for example, using a preform of the filled thermoplastic adhesive positioned between the flip-chip device and the substrate surface, followed by heating to above the glass transition temperature ($T_g$) of the adhesive. In such embodiments and also in alternative embodiments in which the filled thermoplastic adhesive is interposed between the substrate and the flip-chip in a molten state, there is no need for the step of oven curing, as in the case of prior known epoxy or other thermosetting undercoat materials.

In addition, good performance characteristics, including adhesive bond durability, can be achieved due to the lower composite coefficient of thermal expansion achieved through higher loading levels of low expansion filler in certain preferred embodiments of the filled thermoplastic adhesive. Wicking action need not be relied upon, as in the case of prior known epoxy undercoat materials, so that the rheological effects of higher filler load levels can be accommodated. Such lower composite CTE, especially taken in combination with the superior wetting characteristics of the preferred thermoplastic adhesives discussed further below, particularly in connection with those embodiments employing the filled thermoplastic adhesive as a form-stable (below its $T_g$) preform film interposed between the flip-chip device and the substrate, enable the use of alternative technologies for establishing the electrical connection between the flip-chip device and the substrate. Such alternative technologies include, for example, Au/Au diffusion bonding, eutectic bonding, conductive adhesive bonding and the like. Substantial advantage is thereby achieved, including design flexibility, assembly simplification, cost reduction and/or ease of repair ability as mentioned above.

The advantage of repair ability can be achieved because the filled thermoplastic adhesive can be heated to above its $T_g$ to release the adhesive bond between the flip-chip device and the substrate. Faulty integrated circuits can, therefore, easily be removed from a substrate (involving also releasing the electrical connection) and replaced by a new device at the same bonding site, potentially even reusing the original filled thermoplastic adhesive as the underfill material for the new device.

Additional features and advantages will be recognized by those skilled in the art in connection with the following detailed discussion of certain preferred embodiments.

BRIEF DESCRIPTION OF THE DRAWINGS

Certain preferred embodiments will be described in further detail below in connection with the appended drawings wherein.

Figure 1:
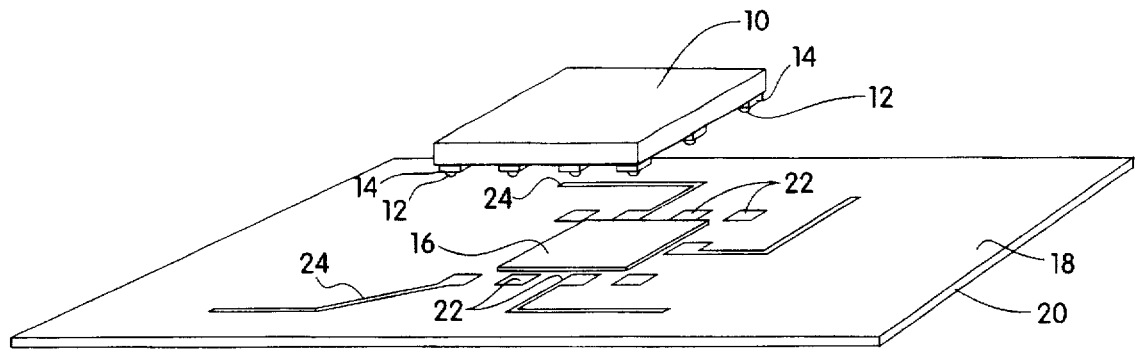
FIG. 1 is a schematic perspective view of a flip-chip assembly in accordance with one preferred embodiment, prepared for bonding.

It should be understood that the above mentioned drawings have been simplified in some respects for clarity. In addition, the dimension of certain features or elements has been modified for ease of illustration. For example, the filled thermoplastic adhesive preform best seen in FIG. 1, is illustrated with greater relative thickness than would be used in most applications. In general, design features will depend primarily on the particular application for which the finished assembly is intended. It will be well within the ability of those skilled in the art, given the benefit of the present disclosure, to select such design features to meet the needs of particular applications and for particular intended use environments.

DETAILED DESCRIPTION OF CERTAIN PREFERRED EMBODIMENTS

In accordance with the method disclosed above for assembly of a semiconductor electronic flip-chip device to an electrical interconnecting substrate, a filled thermoplastic adhesive is interposed between the active face of the flip-chip device and the attachment or bond site on the surface of the substrate. The flip-chip is then bonded to the substrate, involving the filled thermoplastic adhesive undergoing viscous flow at a temperature above its glass transition ($T_g$) temperature. It should be understood that as the term is used here, viscous flow includes viscoelastic flow. Certain preferred thermoplastic adhesives suitable for use in the disclosed method, discussed further below, do not crystallize and, therefore, do not melt in the strict sense of the word, but rather become viscoelastic at temperatures above their $T_g$ temperature. In accordance with one preferred embodiment, the filled thermoplastic adhesive is interposed between the flip-chip device and the substrate by placing onto the optionally preheated substrate a preform of the filled thermoplastic adhesive. More particularly, the preform preferably is in the form of a substantially uniformly thick film. The film can advantageously be die-cut from a larger sheet of the filled thermoplastic adhesive, and generally will have a thickness between 50 and 150 µm, most preferably about 100 µm. The thickness will depend largely on the particular assembly operation and on the configuration, size, etc., of the flip-chip device and substrate bonding site. The lateral size of the preform, that is, its dimensions in a plane parallel to the surface of the substrate, typically will correspond closely to the die size of the flip-chip device to be bonded to the substrate.

The preform is placed on the substrate centered between the electrical bonding pads at the bonding site. The flip-chip device is then positioned above the filled thermoplastic adhesive preform, such that the corresponding bonding pads on the active surface of the flip-chip, each of which typically has a conductive bump, for example, a solder bump, are directly over the corresponding bonding pads of the substrate. As the flip-chip device is brought into contact with the substrate, heat and z-axial pressure (that is, pressure normal to the plane of the substrate surface) are applied to establish the electrical connection between the flip-chip device and the substrate. Such electrical connection can be established through diffusion bonding, eutectic bonding, conductive adhesive bonding, solder bonding or the like. The filled thermoplastic adhesive preform reaches a temperature greater than its glass transition temperature, and undergoes viscous flow. It will be well within the ability of those skilled in the art, given the advantage of the present disclosure, to calculate or empirically determine a size and configuration for the preform, such that the electrical interconnection is established between the flip-chip device and the substrate just prior to the arrival at the electrical bonding sites of the moving front of the filled thermoplastic adhesive. Most preferably, the preform has a thickness which is 0 to 30 microns greater than the gap between the substrate and the active surface of the flip-chip device in the final assembly. Thus, the preform will experience typically at least a slight compressive squeeze as the assembly is bonded, thereby furthering the viscous flow of the preform as it reaches temperatures above its glass transition temperature. More generally, those skilled in the art will recognize from the present disclosure that the performance characteristics of the preform can be adjusted and controlled through selection of film thickness and other dimensions, the height (that is, in the z-axial dimension) of the electrical interconnect bumps provided at the bonding pads of the substrate or flip-chip device, melt viscosity of the filled thermoplastic adhesive, final desired spacing between the flip-chip device and the substrate, and the process parameters including bonding process temperature and pressure. As mentioned above, implementation of the method disclosed here can achieve substantial process simplification and time reduction over comparable known processes employing liquid epoxy thermosetting undercoat materials requiring a subsequent thermal curing process.

Figure 2:
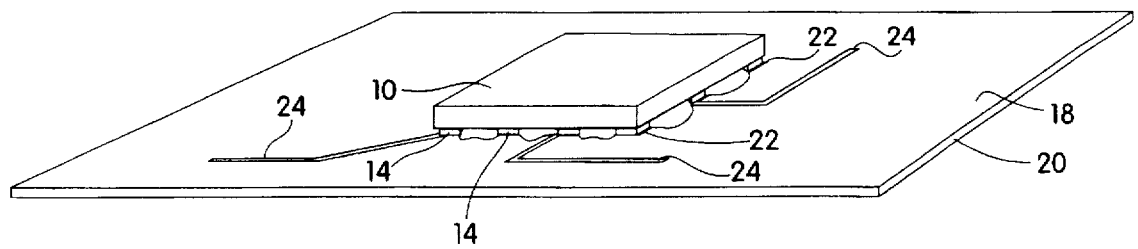
FIG. 2 is a schematic perspective view of the flip-chip assembly of FIG. 1 as an integrated structure subsequent to bonding.

The use of a preform for interposing the filled thermoplastic adhesive between the flip-chip device and the underlying substrate is illustrated in FIGS. 1 and 2. As seen there, a flip-chip device 10 has solder bumps 12 located, one each, at multiple bonding pads 14. A preform 16 of suitable filled thermoplastic adhesive is positioned on the surface 18 of a substrate 20. It is located at a bonding site, being generally centered between bonding pads 22 which correspond in number and position to the bonding pads 14 of the flip-chip device. In a typical application, flip-chip 10 is an integrated circuit and substrate 20 is a printed wiring board ("PWB") having printed leads 24 extending from at least some of the interconnection pads or bonding pads 22. Those skilled in the art will recognize that numerous alternative semiconductor devices can be adhesively secured to any of various substrates in accordance with the method and materials disclosed here. In FIG. 2, the flip-chip device 10 is bonded to the PWB substrate. More specifically, the bonding pads 14 have established electrical connection by solder bonding to the interconnection pads 22 of the substrate by application of heat and pressure. The applied heat and pressure is sufficient, including any optional preheating of the substrate, to elevate the preform 16 above its glass transition temperature, whereby it undergoes viscous flow to spread under the entire area of the flip-chip device 10 and around the interconnection bonds.

The finished device in accordance with preferred embodiments is a repairable flip-chip assembly wherein the semiconductor electronic flip-chip device has established electrical connection with the substrate. The filled thermoplastic adhesive, having undergone viscous flow followed by cooling to a temperature below its glass transition temperature, is sandwiched between the flip-chip device and the substrate, and adhesively fixes the flip-chip device to the substrate.

Figure 3:
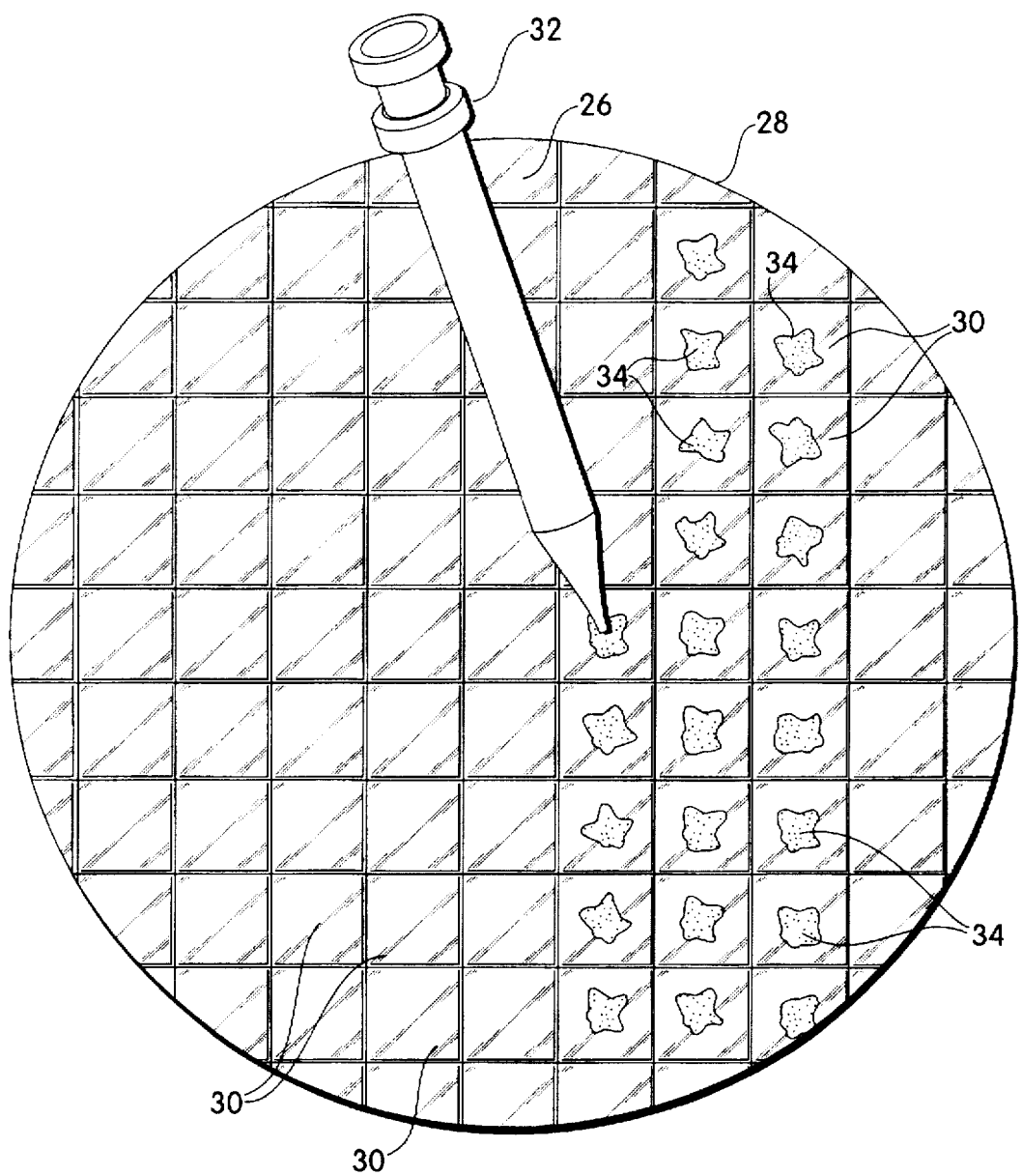
FIG. 3 is a schematic perspective view of an undiced wafer with multiple deposits of filled thermoplastic adhesive from an extrusion syringe.

In accordance with alternative preferred assembly methods, the filled thermoplastic adhesive can be interposed between the flip-chip device and the substrate in a molten or viscous state. One preferred approach is to deposit the filled thermoplastic adhesive by syringe extrusion, wherein a small quantity of the molten adhesive is delivered from the discharge port or nozzle of a delivery tube or "syringe." It can be deposited onto the substrate at the bonding site. Alternatively, it can be deposited onto the active surface of the flip-chip device. In the latter case, it can be deposited or "extruded" onto the active surface at any suitable time prior to assembly. Thus, for example, the adhesive can be deposited as a blob onto the substrate, or onto the flip-chip device active surface as the flip-chip device is being positioned onto the substrate. Alternatively, it can be dispensed from the delivery syringe onto individual die sites of a diced or undiced silicon wafer, thereby eliminating the formation and handling of the preform discussed above. Referring in this regard to FIG. 3, surface 26 of silicon wafer 28 is seen to comprise a plurality of die sites 30 which have not as yet been separated. An extrusion syringe 32 is delivering individual blobs 34 of filled thermoplastic adhesive onto each of the die sites 30. At the point in the process illustrated in FIG. 3, a number of the die sites have already been treated and a number remain to be treated. Those skilled in the art, with the benefit of the present disclosure, will recognize that suitable equipment is commercially available for syringe extrusion of filled thermoplastic adhesive onto the individual die sites of a wafer, either before or after the dicing operation. Similarly, syringe extrusion equipment and techniques will be readily adapted, given the aid of this disclosure, to depositing blobs of the filled thermoplastic adhesive onto the flip-chip device or substrate surface at the time of flip-chip assembly.

Suitable filled thermoplastic adhesives will be apparent to those skilled in the art in view of the present disclosure. Commercially available fillers and commercially available thermoplastic adhesive materials can be combined in accordance with the principles disclosed here to achieve performance characteristics meeting the processing parameters of particular applications. In accordance with one aspect of the invention, highly preferred filled thermoplastic adhesives comprise low expansion filler and poly(aryl ether ketone) adhesive having the rheology (with filler) as described above, with (i) a glass transition temperature between 85° C. and 400° C., more preferably between 125° C. and 300° C., (ii) a linear coefficient of thermal expansion of 40 to 100, more preferably 40 to 60, (iii) a reduced viscosity (measured at 25° C., 0.5 g of polymer per deciliter) between 0.4 and 1.0 deciliters per gram, and (iv) a polydispersity ($\overline{M}_w/\overline{M}_n$) ranging from 2.0 to 3.0. Most preferably, particularly for assembly of flip-chip devices for use in automotive applications, the filled thermoplastic adhesive has a glass transition temperature between 150° C. and 240° C. Highly preferred poly(aryl ether ketones) include those of the general chemical formula I below:

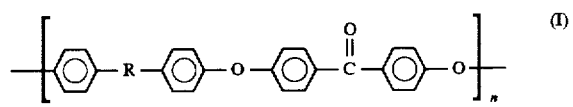

wherein n preferably is from 5 to 150 and R is a divalent connector group selected preferably from

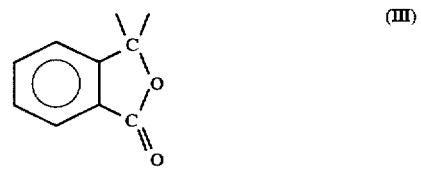

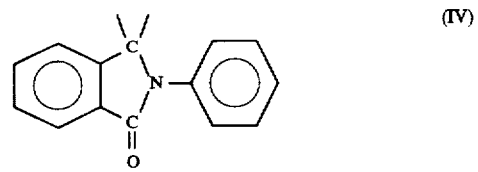

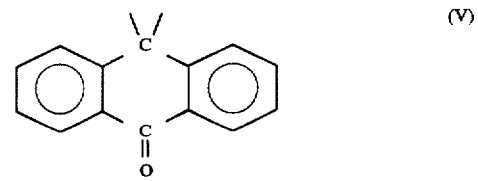

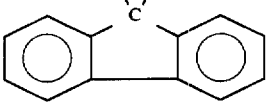

The poly(aryl ether ketone) adhesives in accordance with formulas I and II–VI above, most preferably have a glass transition temperature between 150° and 245° C. Adhesives of formulas I and II preferably have a $T_g$ between 150° and 160° C. Those of formulas I and III and those of formulas I and IV preferably have a $T_g$ between 230° and 240° C. Those of formulas I and V preferably have a $T_g$ between 240° and 245° C. Those of formulas I and VI preferably have a $T_g$ about 225° C. The poly(aryl ether ketone) in accordance with formula I above can be synthesized in accordance with known procedures, such as set forth in Vinogradova et al., *Aromatic Polyethers of the "Cardac" Type*, Polymer Science U.S.S.R., Pergamon Press (English Translation), pp. 2962–2970 (1971) and Johnson et al., *Poly(aryl Ethers) by Nucleophilic Aromatic Substitution. I. Synthesis and Properties*, Journal of Polymer Science: Part A-1, Vol. 5, pp. 2375–2398 (1967). Those skilled in the art, in view of the present disclosure, will recognize the suitability of analogs of the above poly(aryl ether ketone) and other similar compounds.

Figure 4:
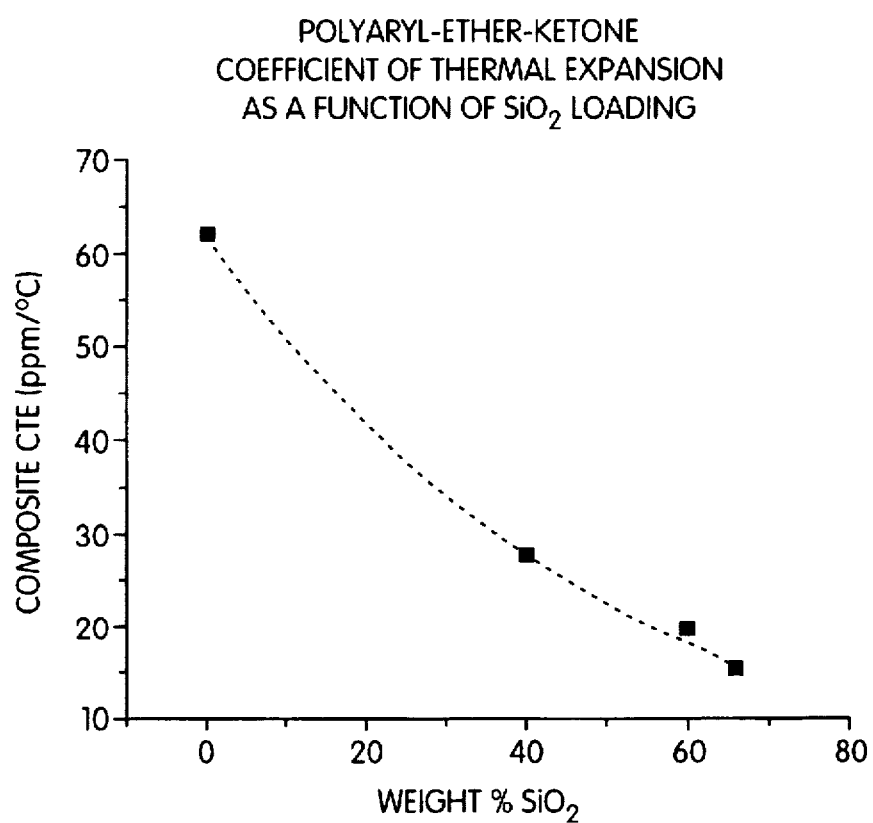
FIG. 4 is a graph showing the composite coefficient of thermal expansion of filled thermoplastic adhesive in accordance with a preferred embodiment consisting essentially of poly(aryl ether ketone) and $SiO_2$ particulate filler, wherein the coefficient is shown as a function of $SiO_2$ weight percent.

Numerous suitable low expansion fillers are commercially available, and will be apparent to those skilled in the art in view of the present disclosure. One highly preferred filler, in view of its relatively low cost and ready commercial availability, is silicon dioxide having a substantially normal particle distribution with at least 90% from 8 to 12 microns in diameter. Those skilled in the art will recognize that various interdependent factors will determine the suitability of a given filler material, including the viscosity of the unfilled adhesive, the particle size and configuration of the filler, and the load level of the filler. In general, the aforesaid preferred silicon dioxide filler can be used in the above disclosed preferred poly(aryl ether ketone) adhesives in an amount between 40 and 70 weight percent of the filled thermoplastic adhesive. Other preferred low expansion fillers include those having a coefficient of thermal expansion less than 10 ppm/°C., more preferably less than 1 ppm/°C. The silicon dioxide filler disclosed above has a coefficient of thermal expansion of approximately 0.5 ppm/°C. Other suitable low expansion fillers include, for example, aluminium oxide, aluminum nitride, La2O3, Nb2O5, TaVO5, Corning 9617 Glass, Corning 9618 Glass, several Li2O-Al2O3-SiO2 phases including B-Eucryptite and B-Spodumene. In fact, certain low expansion fillers have a negative coefficient of thermal expansion in the expected operating temperature range of a typical motor vehicle application. Additional exemplary fillers suitable for use here are discussed in Chu et al., *Negative Thermal Expansion Ceramics: A Review*, Materials Science and Engineering, pp. 303–308 (1987). The filled thermoplastic adhesive has a composite coefficient of thermal expansion determined by the individual coefficients of the adhesive and the filler. Most preferably, the composite coefficient of thermal expansion for the filled thermoplastic adhesive is between and 5 and 40 ppm/°C., most preferably for automative applications between 15 and 25 ppm/°C. Filler forms may also be varied: SiO2 microballoons and fly-ash may be beneficial in certain applications for modification of rheology and dielectric properties. The composite coefficient of thermal expansion refers to the property of the hardened adhesive (that is, the filled thermoplastic adhesive after it is cooled to a temperature below its glass transition temperature) within the expected operating temperature range. It should also be recognized that the matrix or polymer binder of the filled thermoplastic adhesive may be a homopolymer, a polymer mix, a copolymer, etc. The composite coefficient of thermal expansion is shown in FIG. 4 as a function of the weight percent $SiO_2$ in the above disclosed preferred poly(aryl ether ketone) in accordance with formulas I and II, having a viscosity (without filler) at 250° C. of approximately 500,000 poise and reduced viscosity of 1.0 deciliter per gram.

It will be apparent from the foregoing that various additional components can be included in the filled thermoplastic adhesive including, for example, rheology modifiers, colorants, wetting agents, etc. It will be within the ability of those skilled in the art, given the benefit of the present disclosure, to select suitable such additives for a particular application. More generally, it will be apparent that various modifications can be made to the preferred embodiments disclosed above without departing from the true scope and spirit of the present invention. All such modifications are intended to be included within the scope of the appended claims.

We claim:

1. A repairable flip-chip assembly comprising:

an electrical interconnecting substrate having a plurality of bonding pads at a bonding site on a substrate surface;

a semiconductor electronic flip-chip device having an electronic circuit and a plurality of bonding pads on an active surface facing the substrate surface, the plurality bonding pads of the flip-chip device being coupled to both the electronic circuit and corresponding ones of the bonding pads of the substrate; and a filled thermoplastic adhesive sandwiched between the flip-chip device and the substrate surface, adhesively fixing the flip-chip device to the substrate.

2. A repairable flip-chip assembly comprising:

an electrical interconnecting substrate having a plurality of bonding pads at a bonding site on a substrate surface;

a semiconductor electronic flip-chip device having an active surface facing the substrate surface, the plurality bonding pads of the flip-chip device being coupled to both the electronic circuit and corresponding ones of the bonding pads of the substrate; and a filled thermoplastic adhesive sandwiched between the flip-chip device and the substrate surface, adhesively fixing the device to the substrate, wherein the filled thermoplastic adhesive comprises low expansion filler and poly(aryl ether ketone) having (i) a glass transition temperature between 85° C. and 400° C., (ii) a linear coefficient of thermal expansion of 40 to 100, (iii) a reduced viscosity (measured at 25° C., 0.5 g of polymer per deciliter) between 0.4 and 1.0 deciliters per gram, and (iv) a polydispersity between 2.0 and 3.0.

3. The repairable flip-chip assembly in accordance with claim 2 wherein the poly(aryl ether ketone) of the filled thermoplastic adhesive has the chemical formula

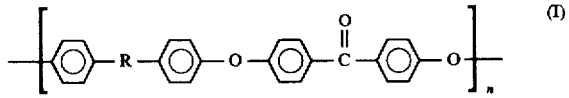

where n is from 5 to 150 and R is selected from
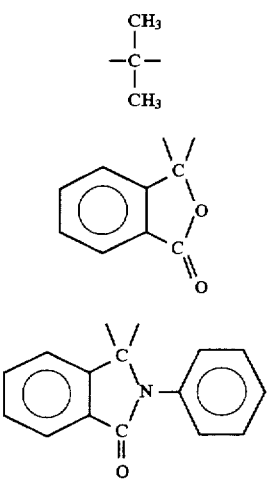
(II)
(III)
(IV)
-continued
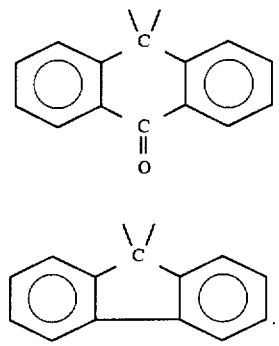
(V)
(VI)
* * * * *